United States Patent [19]

Hamakawa et al.

[11] Patent Number: 4,820,915
[45] Date of Patent: Apr. 11, 1989

[54] COLOR SENSOR WITH AMORPHOUS PIN STRUCTURE

[75] Inventors: Yoshihiro Hamakawa, Kawanishi; Funio Koike, Yokohama; Tetsuya Miyagishi, Kamakura, all of Japan

[73] Assignee: Yamatake-Honeywell Co., Ltd., Tokyo, Japan

[21] Appl. No.: 105,440

[22] Filed: Oct. 5, 1987

[30] Foreign Application Priority Data

Oct. 8, 1986 [JP] Japan .................................. 61-237879

[51] Int. Cl.$^4$ .............................................. H01J 40/14
[52] U.S. Cl. .................................. 250/211 J; 250/226; 357/2
[58] Field of Search .................. 250/211 J, 226; 357/2, 357/30 K, 30 D, 30 R, 30 P, 59 C

[56] References Cited

U.S. PATENT DOCUMENTS

| | | | |
|---|---|---|---|
| 2,986,591 | 5/1961 | Swanson et al. | 250/211 J |
| 4,011,016 | 3/1977 | Layne et al. | 357/30 D |
| 4,271,328 | 6/1981 | Hamakawa et al. | 357/2 |
| 4,616,246 | 10/1986 | Delahoy | 357/2 |

Primary Examiner—David C. Nelms
Attorney, Agent, or Firm—Mitchell J. Halista; Albin Medved

[57] ABSTRACT

A color sensor has a layered body obtained by stacking a first photoelectric sensor which is constituted by an amorphous semiconductor having a "PIN" structure and a spectral sensitivity which has a peak with respect to blue light and a second photoelectric sensor which is constituted by an amorphous semiconductor having a "PIN" structure and a spectral sensitivity which has a peak with respect to red light, so that a p-n junction is formed therebetween, and a pair of electrodes with each of the electrodes being provided at a respective end of the body, at least one of the pair of electrodes being transparent. A color measuring apparatus uses the color sensor with a bias voltage supply for supplying three different bias voltages between the sensor and the pair of electrodes, a photo-current detector for detecting photo-currents for each bias voltage and a color discriminator for discriminating incident light color on the basis of the detected photo-currents.

8 Claims, 4 Drawing Sheets

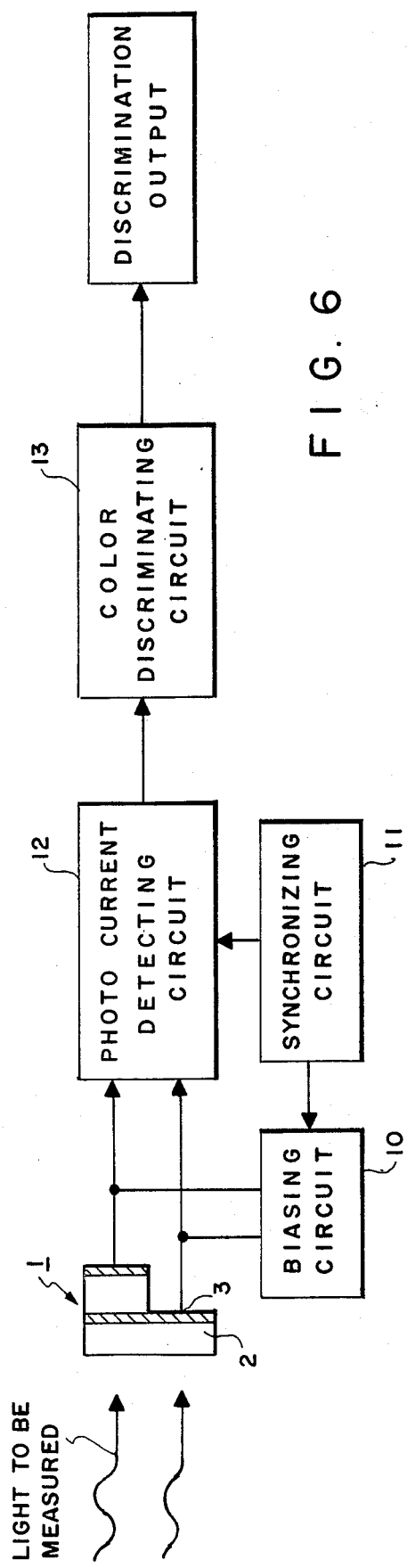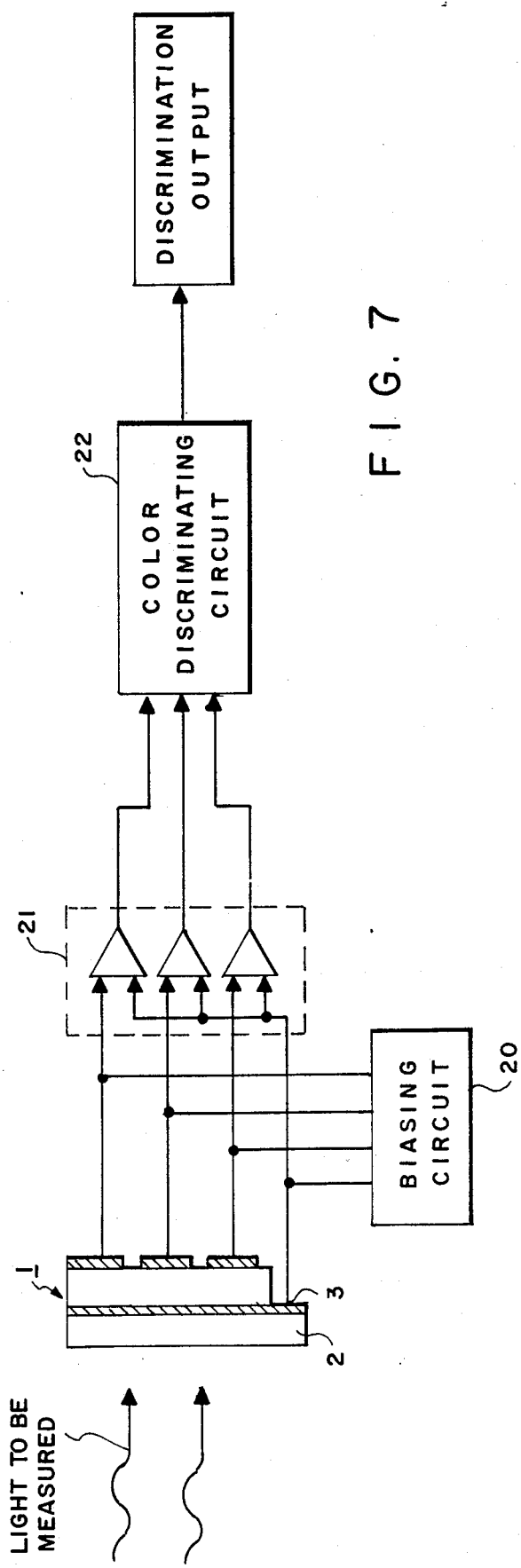

COLOR SENSOR WITH AMORPHOUS PIN STRUCTURE

BACKGROUND OF THE INVENTION

1. Field of the Invention

The present invention relates to a color sensor having a color separation function of three primary color components of red, blue and green and, more particularly, to a color sensor for separating the three primary color components without a color separation filter.

2. Description of the Prior Art

The prior art discloses an example of a color sensor in which an optical filter, e.g., of color organic resin, is adhered to a sensor element of amorphous silicon, thereby realizing color separation. A photoelectric sensor of amorphous silicon is used as a basic element of a color sensor since its light-receiving sensitivity characteristic is very close to a visual sensitivity. That is, according to a photoelectric sensor of amorphous silicon, color information can be extracted without being affected by light in a near-infrared region of 700 nm or more and without using an infrared blocking filter.

However, according to the above conventional technique for obtaining a color sensor by adhering an optical filter, e.g., of organic resin, to a sensor element, color sensor characteristics are undesirably changed due to deterioration over time of a spectral transmittance characteristic of the optical filter or degradation thereof under a high temperature condition. In addition, since an optical filter must be directly adhered to a sensor element itself, the size of a color sensor depends on that of an optical filter and hence compactness thereof is limited. Moreover, since blue sensitivity, which is originally low, is further reduced by providing an optical filter, a color having color characteristics at a blue cannot be sufficiently discriminated.

SUMMARY OF THE INVENTION

An object of the present invention is to provide an improved color sensor for separating the three primary color components without a color separation filter.

In accomplishing this and other objects, there has been provided, in accordance with the present invention, a color sensor comprising a layered body obtained by stacking a first photoelectric sensor which is constituted by an amorphous semiconductor having a "PIN" structure and a spectral sensitivity which has a peak with respect to blue light and a second photoelectric sensor which is constituted by an amorphous semiconductor having a "PIN" structure and a spectral sensitivity which has a peak with respect to red light, so that a p-n junction is formed therebetween, and a pair of electrodes with each of the electrodes being provided at a respective end of the body, at least one of the pair of electrodes being transparent.

BRIEF DESCRIPTION OF THE DRAWINGS

FIG. 6 is a block diagram showing an embodiment of a color measuring apparatus of the present invention, and FIG. 7 is a block diagram showing still another embodiment of the color measuring apparatus of the present invention.

DESCRIPTION OF THE PREFERRED EMBODIMENT

A color sensor of the present invention is constituted by a layered body obtained by stacking a first photoelectric sensor which is constituted by an amorphous semiconductor of a "PIN" structure and a spectral sensitivity which has a peak with respect to blue light and a second photoelectric sensor which is constituted by an amorphous semiconductor of a "PIN" structure and a spectral sensitivity which has a peak with respect to red light, so that a p-n junction is formed therebetween and a pair of electrodes provided at both ends of the body, at least one of the pair of electrodes being transparent.

In addition, a color measuring apparatus of the present invention comprises a bias voltage applying means capable of applying three different bias voltages between the color sensor and the pair of electrodes, a photo-current detecting means for detecting photo-currents corresponding to the respective bias voltages, and a color discriminating means for discriminating a color of light incident on the color sensor on the basis of the photo-current detecting means. Further, another color measuring apparatus of the present invention uses a three electrode structure at one of the electrodes of the color sensor, and comprises a bias voltage applying means for applying different bias voltages between the three electrodes and the other common electrode, a photo-current detecting means for detecting photo-currents obtained in the respective three electrodes, and a color discriminating means for discriminating a color of light incident on the color sensor on the basis of the photo-current detecting means. By applying different bias voltages between electrodes, spectral sensitivity characteristics having peaks respectively at wavelength bands of green, red and blue can be obtained. A color is discriminated by predetermined calculations in accordance with photo-currents output on the basis of these spectral sensitivity characteristics.

Figure 1:
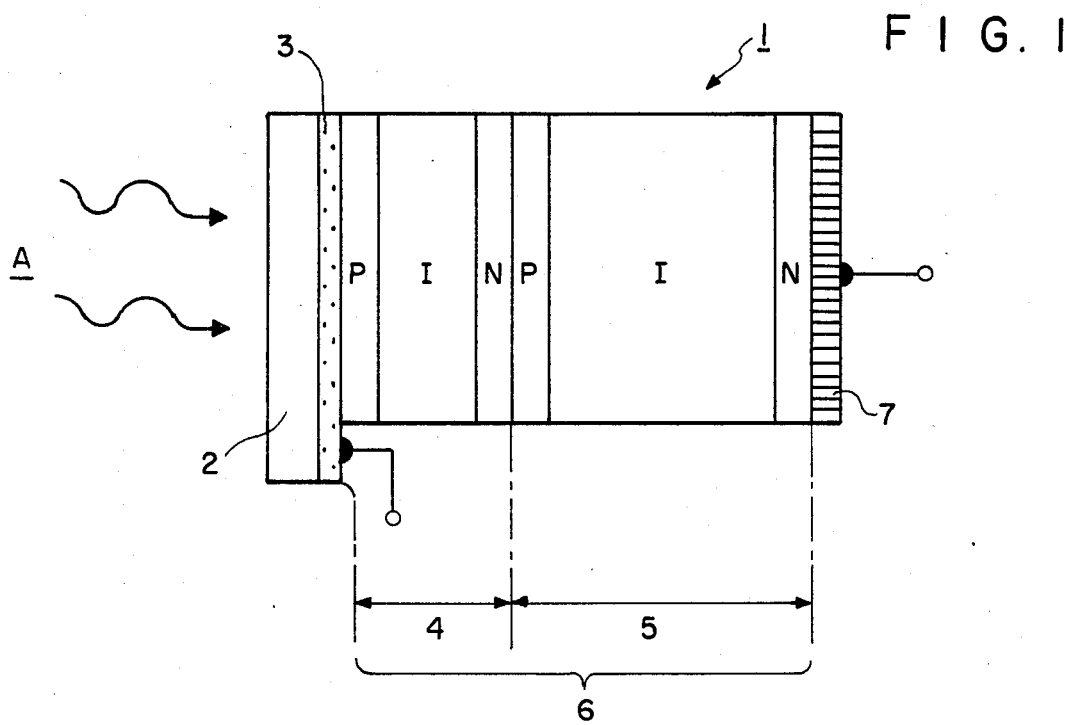
FIG. 1 is a side view of a color sensor embodying an example of the present invention.

FIG. 1 is a side view of a color sensor 1 of the present invention. In FIG. 1, reference numeral 2 denotes a transparent glass substrate; and reference numeral 3 is a transparent electrode formed on the glass substrate 2. A first photoelectric sensor 4 of amorphous silicon is formed on the transparent eletrode 3 with a "PIN" structure and serves as a front amorphous photoelectric sensor in relation to an incident direction of reflected light or transmitting light (to be referred to as light to be measured hereinafter) A from an object, a color of which is to measured. A second photoelectric sensor 5 of amorphous silicon is formed on the front or first amorphous photoelectric sensor 4 with a "PIN" structure and serves as a rear amorphous photoelectric sensor in relation to an incident direction of the light to be measured "A". A p-layer of the rear amorphous photoelectric sensor 5 is formed adjacent to an n-layer of the front amorphous photoelectric sensor 4, thereby constituting a photoelectric sensor layered body 6. Reference numeral 7 denotes a rear surface electrode, formed on the rear amorphous photoelectric sensor 5, for extracting a photo-current generated in the color sensor 1 from the rear surface electrode 7 and the transparent electrode 3.

An operation of the color sensor 1 will now be described. When the light to be measured "A" is incident on the color sensor 1 from the glass substrate 2, a short wavelength component of the light to be measured is mainly absorbed in an I-layer of the front amorphous photoelectric sensor 4 to generate carriers and a long wavelength component thereof is mainly absorbed in an I-layer of the rear amorphous photoelectric sensor 5 to generate carriers since an absorption coefficient of amorphous silicon is exponentially reduced from short to long wavelengths.

Carriers generated in the front and rear amorphous sensors 4 and 5 are recombined on a p-n interface as a junction surface therebetween. In this case, since the photoelectric sensors 4 and 5 of the color sensor 1 constitute a tandem structure of a "PINPIN" structure, it can be equivalently assumed that two current sources are connected in series. Therefore, the photo-current generated in the color sensor 1 is restricted and determined by the lower one of the carriers generated by the front and rear amorphous photoelectric sensors 4 and 5.

Figure 2:
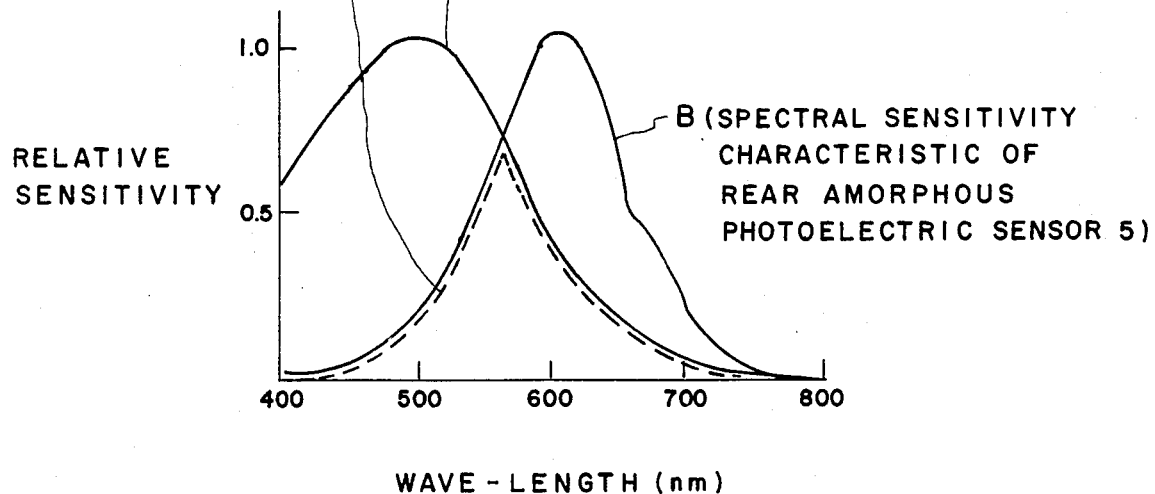
FIG. 2 is a graph showing spectral sensitivity characteristics of the color sensor shown in FIG. 1.

The above operation will now be described with reference to a graph shown in FIG. 2. FIG. 2 shows spectral sensitivity characteristics of the front and rear amorphous photoelectric sensors 4 and 5 formed between the transparent and rear surface electrodes 3 and 7. The spectral sensitivity characteristic at a short wavelength side of the color sensor 1 is restricted and determined by the base portion of a spectral sensitivity characteristic B of the rear amorphous photoelectric sensor 5 which generates fewer carriers. The spectral sensitivity characteristics at a long wavelength side thereof is restricted and determined by the base portion of a spectral sensitivity characteristic "A" of the front amorphous photoelectric sensor 4 which generates few carriers. As a result, the spectral sensitivity characteristic of the color sensor 1 becomes a shown by a broken line "C" in FIG. 2.

Assume that a thickness of the I-layer of the front amorphous photoelectric sensor 4 is smaller than that of the I-layer of the rear amorphous photoelectric sensor 5. In this case, when a reverse bias voltage is applied to the color sensor 1 through the transparent and rear surface electrodes 3 and 7, the carriers generated in the front amorphous photoelectric sensor 4 having the thinner I-layer reach the p-n interface in a number larger than that of carriers generated in the rear amorphous photoelectric sensor 5 having the thicker I-layer since the intensities of electric fields in the I-layers of both the front and rear amorphous photoelectric sensors 4 and 5 are substantially the same. Therefore, when a relatively low reverse bias voltage is applied, the magnitude of the photo-current generated in the entire color sensor is determined by the spectral sensitivity characteristic "B" of the rear amorphous photoelectric sensor 5 having fewer carriers which can reach the p-n interface. That is, the spectral sensitivity at the long wavelength side largely increases while the spectral sensitivity at the short wavelength side almost does not increase in the spectral sensitivity characteristic C of the color sensor 1 due to application of the reverse bias voltage.

If the electric field generated in the I-layer of the front amorphous photoelectric sensor 4 upon application of the reverse bias voltage has an intensity which generates saturation wherein most of the carriers generated in the front amorphous photoelectric sensor 4 reach the p-n interface, the spectral sensitivity characteristic of the color sensor 1 is kept determined by the rear amorphous photoelectric sensor 5 having fewer carriers which reach the p-n interface.

However, when the applied reverse bias voltage largely exceeds the electric field which generates the saturation, extremely strong electric fields are respectively generated in the I-layers of both the front and rear amorphous photoelectric sensors 4 and 5, and the electric field intensity in the p-n interface is largely increased. For this reason, it can be assumed that the carriers generated in the front amorphous photoelectric sensor 4 and reaching the p-n interface are injected into the rear amorphous photoelectric sensor 5 and reach the rear surface electrode 7 without recombination through a local level. That is, since the carriers generated in the front amorphous photoelectric sensor 4 by incidence mainly of a short wavelength are forcibly attracted to the rear surface electrode 7 and extracted as a photo-current, the spectral sensitivity largely increases toward a short wavelength side of the color sensor 1.

Figure 3:
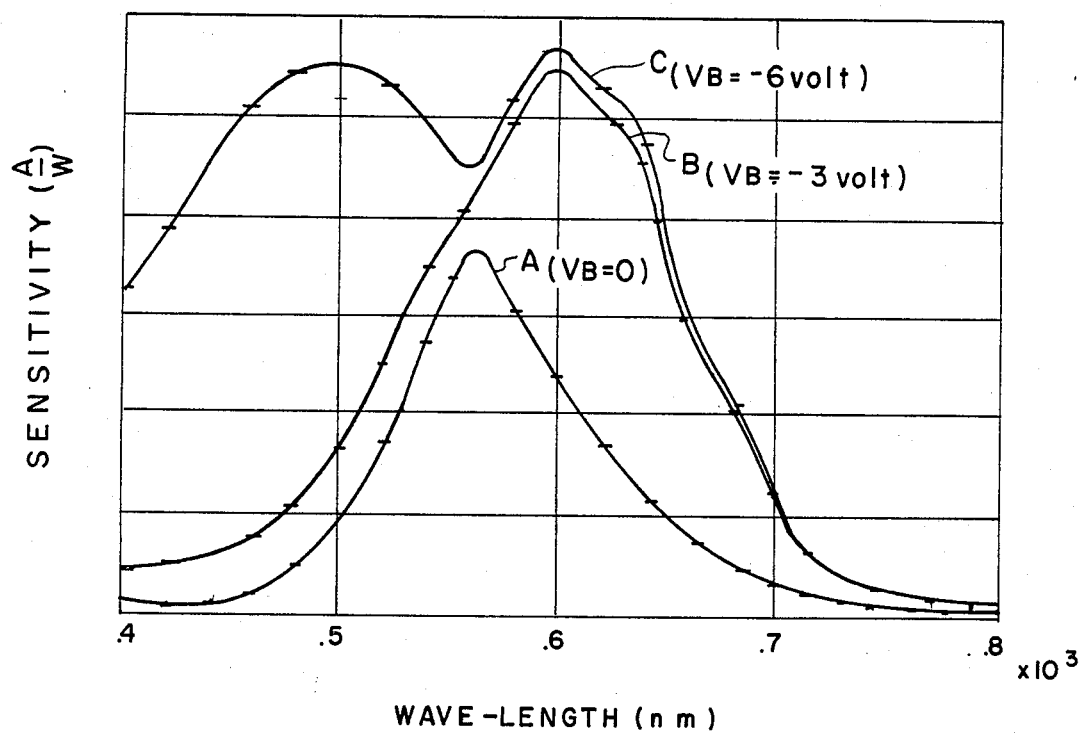
FIG. 3 is a graph showing spectral sensitivity characteristics the color sensor obtained when an applied voltage is changed.

FIG. 3 shows a result of an experiment conducted by using the color sensor 1 so as to prove a change in the spectral sensitivity characteristics along with a change in the reverse bias applied voltage described above. In FIG. 3, the abscissa represents a wavelength (nm) and the ordinate represents sensitivity (A/W). In the color sensor 1 used in this experiment, a thickness of the I-layer of the front amorphous photoelectric sensor 4 is 1,000 A, a thickness of the I-layer of the rear amorphous photoelectric sensor 5 is 5,000 A, and the reverse bias voltage $V_B$ is set such that $V_B = 0$ V, $-3$ V, and $-6$ V. Note that a light-receiving area is 12 mm$^2$.

As is apparent from FIG. 3, when the reverse bias voltage $V_B$ is 0 V (the characteristic "A"), the spectral sensitivity characteristic exhibits a sensitivity spectrum close to visual sensitivity having a peak near 560 nm which corresponds to an overlapped portion of the spectral sensitivity characteristics of the front and rear amorphous photoelectric sensors 4 and 5. When the reverse bias voltage $V_B$ is set at $-3$ V, the spectral sensitivity at the short wavelength side is increased to a sensitivity spectrum of the rear amorphous photoelectric sensor 5 having a peak near 600 nm (the characteristic "B"). When the reverse bias voltage $V_B$ is increased to $-6$ V, a sensitive spectrum corresponding to a sum of the spectral sensitivities of both the front and rear amorphous photoelectric sensors 4 and 5 is obtained (the characteristic "C").

In the color sensor 1 as described above, assume that the spectral sensitivity characteristic obtained when the reverse bias voltage $V_B$ is 0 V is represented as I(0), that obtained when $V_B$ is $-6$ V is represented as I($-3$), and that obtained when $V_B$ is $-6$ V is represented as I($-6$), and the following equations are calculated and plotted in units of wavelengths:

$$Ia = I(0) \qquad (1)$$

$$Ib = I(-3) - I(0) \qquad (2)$$

$$Ic = I(-6) - I(-3) \qquad (3)$$

Figure 4:
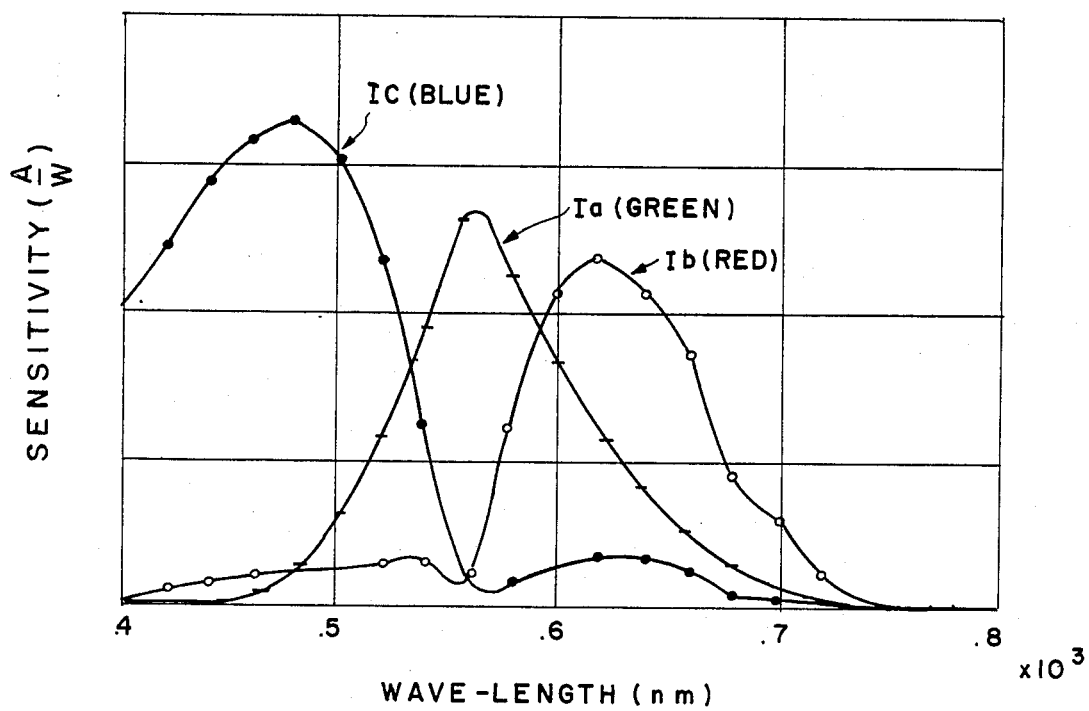
FIG. 4 is a graph showing corrected spectral sensitivity characteristics of the color sensor.

As a result, spectral sensitivity characteristics Ia, Ib and Ic which are color-separated and substantially corresponding to three primary colors of green, red and blue can be obtained, as shown in FIG. 4. That is, the characteristic Ia has high sensitivity near 560 nm and hence is highly sensitive to green, the characteristic Ib has high sensitivity near 620 nm and hence is highly sensitive to red, and the characteristic Ic has high sensitivity near 470 nm and hence is highly sensitive to blue. Thus, a three-color separation color sensor in which colors are sufficiently separated is achieved.

Figure 5:
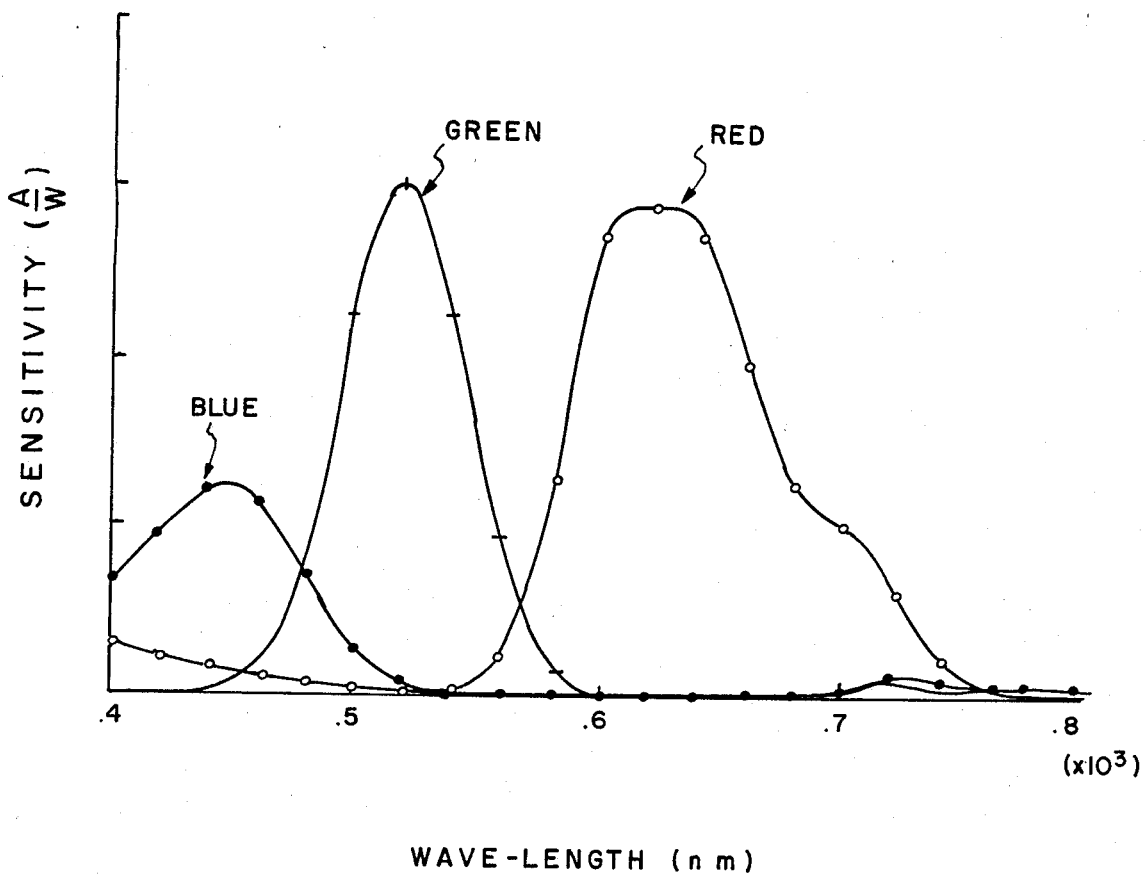
FIG. 5 is a graph showing spectral sensitivity characteristics of a conventional color sensor.

In addition, according to this color sensor, sensitivity of blue is significantly high as compared with a conventional three-color separation color sensor in which an optical filter made of a color organic resin is adhered on a photoelectric sensor of amorphous silicon. FIG. 5 shows the spectral sensitivity characteristic of the conventional color sensor described above. It is seen from FIG. 5 that a peak of the spectral sensitivity of blue is very low as compared with a peak of the spectral sensitivity of green or red. On the contrary, according to the color sensor of this embodiment, the spectral sensitivity characteristic Ic of blue is sufficiently high as shown in FIG. 4.

In the above embodiment, the light to be measured is incident from the glass substrate 2. However, the present invention is not limited to the above embodiment. For example, the light to be measured may be incident from the rear surface electrode 7. In this case, the rear surface electrode 7 must be formed by a transparent electrode. On the contrary, the transparent electrode 3 shown in FIG. 1 need not be limited to a transparent electrode but may be formed by a metal electrode. In addition, since the glass substrate 2 need not be transparent, the substrate may be formed by stainless steel or ceramics. Further, the tandem structure of the front and rear amorphous photoelectric sensors 4 and 5 need not be a "PINPIN" structure but may be an "NIPNIP" structure.

Moreover, the experimental data of FIG. 3 used to explain the operation principle of the present invention is obtained when a thickness of the I-layer of the front amorphous photoelectric sensor 4 is 1,000 Å, a thickness of the I-layer of the rear amorphous photoelectric sensor 5 is 5,000 Å, and the reverse bias voltages to be applied to the color sensor 1 are 0 V, −3 V and −6 V. However, the structure of the color sensor 1 of the present invention is not limited to these values.

However, in order to obtain three-color separation as shown in FIG. 4 in which colors are sufficiently separated and which is suitable for use in a color sensor, first, thicknesses of the I-layers respectively of the front and rear amorphous photoelectric sensors 4 and 5 must be determined such that the spectral characteristics respectively of the front and rear amorphous photoelectric sensors 4 and 5 have relative sensitivities comparatively close to each other as shown in FIG. 1 and which intersect each other at a wavelength region of green. Second, the I-layer of the front amorphous photoelectric sensor 4 at the incident side of the light to be measured must be formed thinner than that of the rear amorphous photoelectric sensor 5. This is because the front amorphous photoelectric sensor 4 is saturated by application of a lower reverse bias voltage. Third, as a reverse bias voltage to be applied, a level which can increase the spectral sensitivity at the long wavelength side of the color sensor 1 up to the spectral sensitivity at the long wavelength side of the rear amorphous photoelectric sensor 5 while maintaining saturation of the front amorphous photoelectric sensor 4 and a level which can increase the spectral sensitivity at the short wavelength side of the color sensor 1 up to the spectral sensitivity at the short wavelength side of the front amorphous photoelectric sensor 4 by tunneling must be prepared.

A color measuring apparatus using the color sensor 1 will now be described. FIG. 6 is a block diagram showing an embodiment of a color measuring apparatus of the present invention. According to this embodiment, reverse bias voltages to be applied to the color sensor 1 are sequentially selected to obtain photo-currents I(0), I(−3) and I(−6), thereby obtaining Ia, Ib and Ic by calculation.

FIG. 6, reference numeral 10 denotes a biasing circuit means for applying a reverse bias voltage to the color sensor 1. The biasing circuit means 10 selectively applies one of three preset reverse bias voltages (−6 V, −3 V and 0 V) to the color sensor 1. Reference numeral 11 denotes a synchronizing circuit means for generating a sync signal for sequentially selecting the three reverse bias voltages applied to the color sensor 1 by the biasing circuit means 10. Reference numeral 12 denotes a photo-current detecting circuit means having a function of detecting a photo-current of the color sensor 1 generated when the reverse bias voltage is applied by the biasing circuit means 10. Reference numeral 13 denotes a color discriminating circuit means having a function of obtaining Ia, Ib and Ic by operating equations (1) to (3) for three photo-currents obtained by the photo-current detecting circuit means 12, thereby obtaining a color of the light to be measured in accordance with values of Ia, Ib and Ic.

An overall operation of the color measuring apparatus having the above arrangement will be briefly described below. The biasing circuit means 10 sequentially applies the reverse bias voltages of 0 V, −3 V and −6 V to the color sensor, on which the light to be measured is incident, in accordance with the sync signal generated from the synchronizing circuit means 11. The photo-current detecting circuit means 12 samples the photo-currents I(0), I(−3) and I(−6) obtained when the reverse bias voltages are applied using the sync signal of the synchronizing circuit means 11. The color discriminating means 13 calculates Ia, Ib and Ic by predetermined calculations in accordance with I(0), I(−3) and I(−6) obtained by the photo-current detecting circuit means 12, and discriminates a color of the light to be measured in accordance with a calculation result.

FIG. 7 is a block diagram of another embodiment of the color measuring apparatus of the present invention. In the color sensor 1 of this embodiment, the transparent electrode 3 is a common electrode, and the rear surface electrode 7 is divided into three portions. That is, the color sensor 1 has three color sensors. Reference numeral 20 denotes a biasing circuit means for applying predetermined reverse bias voltages respectively to the three pairs of electrodes of the color sensor 1. In this embodiment, voltages of 0 V, −3 V and −6 V are applied to the electrode pairs, respectively. Reference numeral 21 denotes a photo-current detecting circuit means which is substantially an amplifying 430 sensor 1. Reference numeral 22 denotes a color discriminating circuit means for obtaining Ia, Ib and Ic by operating the equations (1) to (3) for the three photo-currents obtained by the photo-current detecting circuit 21, thereby obtaining a color of the light to be measured in accordance with values of Ia, Ib and Ic.

In this embodiment, the biasing circuit means 20 applies the reverse bias voltages of 0 V, −3 V and −6 respectively to the three pairs of electrodes of the color sensor 1 on which the light to be measured is incident.

The photo-current detecting circuit means 21 extracts the three photocurrents I(0), I(−3) and I(−6) from the color sensor 1 obtained when the reverse bias voltages are applied. The color discriminating circuit means 22 calculates Ia, Ib and Ic by predetermined calculation in accordance with the photo-currents I(0), I(−3) and I(−6), and discriminates a color of the light to be measured in accordance with a calculation result.

Of the above two embodiments of the color measuring apparatus, according to the embodiment shown in FIG. 6, since a light-receiving section of the color sensor 1 can be made very compact, an adverse influence of spatial variations of the light to be measured can be eliminated, so that a difference between colors in a very small area can be advantageously discriminated. On the other hand, according to the embodiment shown in FIG. 7, since the three photo-currents of the color sensor 1 are sampled not time-serially but at the same time, colors can be discriminated at high speed. The circuit sections of the color measuring apparatus of the present invention may be realized either by discrete circuit parts or by a microcomputer.

As has been described above, according to the color characteristics having peaks in wavelength bands respectively of green, red and blue can be obtained by applying different reverse bias voltages between the electrodes. That is, according to the color sensor of the present invention, since an optical filter as used in a conventional color sensor is not necessary, a compact sensor can be realized, and the characteristics are not degraded at all due to use of an optical filter. In addition, since amorphous silicon not having sensitivity in a near-infrared region is used as a base, an infrared blocking filter is not necessary. Further, according to the color measuring apparatus of the present invention using this color sensor, colors can be discriminated by predetermined calculations in accordance with photocurrents generated on the basis of the spectral sensitivity characteristics.

Accordingly, it may be seen that there has been provided, in accordance with the present invention, an improved color sensor for separating the three primary color components.

The embodiments of the present invention in which an exclusive property or privilege is claimed are defined as follows:

1. A color measuring apparatus comprising
a color sensor having a layered body obtained by stacking a first photoelectric sensor which is constituted by an amorphous semiconductor having a PIN structure and a spectral sensitivity which has a peak with respect to blue light and a second photoelectric sensor which is constituted by an amorphous semiconductor having a PIN structure and a spectral sensitivity which has a peak with respect to red light, so that a p-n junction is formed therebetween,
a pair of electrodes provided at both ends of said body, at least one of said pair of electrodes being transparent,
bias voltage applying means for applying at least three different bias voltages between said pair of electrodes using a first bias voltage $V_a$ to obtain a first spectral sensitivity $I_a$, a second bias voltage $V_b$ to obtain a second spectral sensitivity $I_b$ and a third bias voltage $V_c$ to obtain a third spectral sensitivity $I_c$ with the sensitivities $I_a$, $I_b$ and $I_c$ being the three primary colors green, red and blue, respectively, with the spectral sensitivities being related by corresponding currents $I_{Va}$, $I_{Vb}$ and $I_{Vc}$ produced by the respective bias voltages $V_a$, $V_b$ and $V_c$ as $I_a = I_{Va}$, $I_b = I_{Vb} - I_{Va}$ and $I_c = I_{Vc} - I_{Vb}$,
photocurrent detecting means for detecting photocurrents $I_{Va}$, $I_{Vb}$ and $I_{Vc}$ corresponding to respective bias voltages, and
color discriminating means for discriminating a color of light incident on said color sensor on the basis of said photocurrent detecting means.

2. An apparatus as set forth in claim 1 wherein an I-layer of said first sensor is thinner than an I-layer of said second sensor and said transparent electrode of said pair of electrodes faces said first sensor.

3. An apparatus as set forth in claim 2 wherein said I-layer of said first sensor is approximately 1000 Å and said I-layer of said second sensor is approximately 5000 Å, 4. An apparatus as set forth in claim 3 wherein said bias voltages $V_a$, $V_b$ and $V_c$ are, respectively, 0 V, −3V and −6 V.

5. A color measuring apparatus comprising
a color sensor having a layered body obtained by stacking a first photoelectric sensor which is constituted by an amorphous semiconductor having a "PIN" structure and a spectral sensitivity which has a peak with respect to blue light and a second photoelectric sensor which is constituted by an amorphous semiconductor having a "PIN" structure and a spectral sensitivity which has a peak with respect to red light, so that a p-n junction is formed therebetween,
a common electrode provided at one end of said body,
three individual electrodes provided at the other end of said body to respectively face said common electrode, at least either said common electrode or said individual electrodes being transparent,
bias voltage applying means for applying different bias voltages between the respective individual electrodes and said common electrodes using a first bias voltage $V_a$ to obtain a first spectral sensitivity $I_a$, a second bias voltage $V_b$ to obtain a second spectral sensitivity $I_b$ and a third bias voltage $V_c$ to obtain a third spectral sensitivity $I_c$ with the sensitivities $I_a$, $I_b$ and $I_c$ being the three primary colors green, red and blue, respectively, with the spectral sensitivities being related by corresponding currents $I_{Va}$, $I_{Vb}$ and $I_{Vc}$ produced by the respective bias voltages $V_a$, $V_b$ and $V_c$ as $I_a = I_{Va}$, $I_b = I_{Vb} - I_{Va}$ and $I_c = I_{Vc} - I_{Vb}$,
photo-current detecting means for detecting a photocurrent for each of said individual electrodes,
and color discriminating means for discriminating a color of light incident on said color sensor on the basis of said photo-current detecting means.

6. An apparatus as set forth in claim 5 wherein an I-layer of said first sensor is thinner than an I-layer of said second sensor and said transparent electrode of said pair of electrodes faces said first sensor.

7. An apparatus as set forth in claim 6 wherein said I-layer of said first sensor is approximately 1,000 Å and said I-layer of said second sensor is approximately 5000 Å.

8. An apparatus as set forth in claim 7 wherein said bias voltages $V_a$, $V_b$ and $V_c$ include, respectively, 0 V, −3V and −6 V.

* * * * *